(12) United States Patent
Fujimoto

(10) Patent No.: US 6,310,564 B1
(45) Date of Patent: Oct. 30, 2001

(54) METHOD AND APPARATUS FOR COMPRESSIVELY CODING/DECODING DIGITAL DATA TO REDUCE THE USE OF BAND-WIDTH OR STORAGE SPACE

(75) Inventor: Masakazu Fujimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/369,204

(22) Filed: Aug. 6, 1999

(30) Foreign Application Priority Data

Aug. 7, 1998 (JP) .................................. 10-224686

(51) Int. Cl.[7] ........................................ H03M 5/00
(52) U.S. Cl. ........................ 341/55; 341/51; 382/239
(58) Field of Search ........................ 358/430; 382/56, 382/239, 169; 341/67, 55, 51; 714/500

(56) References Cited

U.S. PATENT DOCUMENTS

| | | | |
|---|---|---|---|
| 5,095,374 | * | 3/1992 | Klein et al. ............... 358/430 |
| 5,303,372 | * | 4/1994 | Oliver et al. ............... 382/56 |
| 5,621,405 | * | 4/1997 | Park et al. ................ 341/67 |
| 5,859,927 | * | 1/1999 | Adams et al. .............. 382/169 |

FOREIGN PATENT DOCUMENTS

63220672 * 9/1988 (JP) ........................................ 370/224

OTHER PUBLICATIONS

"Point Diagram Latest MPEG TEXT"; Editorial: Hiroshi Fujiwara; Editor: Multimedia Research Institute; Publisher: Asuki Corp. Japan; (English language abstract enclosed); Aug. 1, 1994 (first edition).

* cited by examiner

Primary Examiner—David Ton
(74) Attorney, Agent, or Firm—Wenderoth Lind & Ponack, L.L.P.

(57) ABSTRACT

There are provided coding and decoding apparatuses and coding and decoding methods in which digital data are represented by bits fewer than those by which digital data according to the prior art apparatuses and methods are represented, and original data can be decoded correctly without degrading its precision. The number of continuous zeros from the LSB of the digital data 103 is counted. The number on continuous zeros plus one is subtracted from the number of bits of the digital data 103, resulting in a number of bits to-be-allocated 105, according to which, bits are allocated starting from the most significant bit (MSB). The number of omitted bits is calculated according to the number 105 (114), and lower bits represented as the MSB "1" and bits "0". The lower bits 116 are coupled to a lower side of a code 115 to restore original digital data 151.

8 Claims, 12 Drawing Sheets

Fig.5 (a)

| digital data to-be-compressed 151 | b'01010010 |
|---|---|
| compressed digital data 103 | b'01010 |
| number of continuous zeros 104 | 1 |
| "one" addition value 111 | 2 |
| number of bits of digital data 110 | 5 |
| number of bits to-be-allocated 105 | 3 |
| code 106 | b'010 |

Fig.5 (b)

| code 115 | b'010 |
|---|---|
| number of allocated bits 114 | 3 |
| difference | 5 |
| lower bits 116 | b'10000 |
| decoded data 117 | b'01010000 |

Fig.6 (a)

| digital data to-be-compressed 151 | b'11011000 |
|---|---|
| compressed digital data 103 | b'11011 |
| number of continuous zeros 104 | 0 |
| "one" addition value 111 | 1 |
| number of bits of digital data 110 | 5 |
| number of bits to-be-allocated 105 | 4 |
| code 106 | b'1101 |

Fig.6 (b)

| code 115 | b'1101 |
|---|---|
| number of allocated bits 114 | 4 |
| difference | 4 |
| lower bits 116 | b'1000 |
| decoded data 117 | b'11011000 |

Fig.7 (a)

| digital data to-be-compressed 151 | b'10000000 |
|---|---|
| compressed digital data 103 | b'10000 |
| number of continuous zeros 104 | 4 |
| "one" addition value 111 | 5 |
| number of bits of digital data 110 | 5 |
| number of bits to-be-allocated 105 | 0 |
| code 106 | |

Fig.7 (b)

| code 115 | |
|---|---|
| number of allocated bits 114 | 0 |
| difference | 8 |
| lower bits 116 | b'10000000 |
| decoded data 117 | b'10000000 |

Fig.8 (a)

| digital data to-be-compressed 151 | b'00000000 |
|---|---|
| compressed digital data 103 | b'00000 |
| number of continuous zeros 104 | 5 |
| "one" addition value 111 | 6 |
| number of bits of digital data 110 | 5 |
| number of bits to-be-allocated 105 | -1 |
| code 106 | |

Fig.8 (b)

| code 115 | |
|---|---|
| number of allocated bits 114 | -1 |
| difference | (9) |
| lower bits 116 | b'00000000 |
| decoded data 117 | b'00000000 |

Fig.11 (a)

| digital data to-be-compressed 151 | b'01000111 |
| --- | --- |
| compressed digital data 103 | b'01000 |
| number of continuous ones 104 | 0 |
| "one" addition value 111 | 1 |
| number of bits of digital data 110 | 5 |
| number of bits to-be-allocated 105 | 4 |
| code 106 | b'0100 |

Fig.11 (b)

| code 115 | b'0100 |
| --- | --- |
| number of allocated bits 114 | 4 |
| difference | 4 |
| lower bits 116 | b'0111 |
| decoded data 117 | b'01000111 |

Fig.12 (a)

| digital data to-be-compressed 151 | b'11011111 |
| --- | --- |
| compressed digital data 103 | b'11011 |
| number of continuous ones 104 | 2 |
| "one" addition value 111 | 3 |
| number of bits of digital data 110 | 5 |
| number of bits to-be-allocated 105 | 2 |
| code 106 | b'11 |

Fig.12 (b)

| code 115 | b'11 |
| --- | --- |
| number of allocated bits 114 | 2 |
| difference | 6 |
| lower bits 116 | b'011111 |
| decoded data 117 | b'11011111 |

Fig.13 (a)

| digital data to-be-compressed 151 | b'01111111 |
|---|---|
| compressed digital data 103 | b'01111 |
| number of continuous ones 104 | 4 |
| "one" addition value 111 | 5 |
| number of bits of digital data 110 | 5 |
| number of bits to-be-allocated 105 | 0 |
| code 106 | |

Fig.13 (b)

| code 115 | |
|---|---|
| number of allocated bits 114 | 0 |
| difference | 8 |
| lower bits 116 | b'011111111 |
| decoded data 117 | b'011111111 |

Fig.14 (a)

| digital data to-be-compressed 151 | b'11111111 |
|---|---|
| compressed digital data 103 | b'11111 |
| number of continuous ones 104 | 5 |
| "one" addition value 111 | 6 |
| number of bits of digital data 110 | 5 |
| number of bits to-be-allocated 105 | −1 |
| code 106 | |

Fig.14 (b)

| code 115 | |
|---|---|
| number of allocated bits 114 | −1 |
| difference | (9) |
| lower bits 116 | b'11111111 |
| decoded data 117 | b'11111111 |

Fig.15 (a)

| digital data to-be-compressed 151 | b'01011000 |
|---|---|
| number of continuous zeros 104 | 3 |
| "one" addition value 111 | 4 |
| number of bits of digital data 110 | 8 |
| number of bits to-be-allocated 105 | 4 |
| code 106 | b'0101 |

Fig.15 (b)

| code 115 | b'0101 |
|---|---|
| number of allocated bits 114 | 4 |
| difference | 4 |
| lower bits 116 | b'1000 |
| decoded data 117 | b'01011000 |

Fig.16 (a)

| digital data to-be-compressed 151 | b'11011111 |
|---|---|
| number of continuous zeros 104 | 0 |
| "one" addition value 111 | 1 |
| number of bits of digital data 110 | 8 |
| number of bits to-be-allocated 105 | 7 |
| code 106 | b'1101111 |

Fig.16 (b)

| code 115 | b'1101111 |
|---|---|
| number of allocated bits 114 | 7 |
| difference | 1 |
| lower bits 116 | b'1 |
| decoded data 117 | b'11011111 |

Fig.17 (a)

| digital data to-be-compressed 151 | b'10000000 |
|---|---|
| number of continuous zeros 104 | 7 |
| "one" addition value 111 | 8 |
| number of bits of digital data 110 | 8 |
| number of bits to-be-allocated 105 | 0 |
| code 106 | |

Fig.17 (b)

| code 115 | |
|---|---|
| number of allocated bits 114 | 0 |
| difference | 8 |
| lower bits 116 | b'10000000 |
| decoded data 117 | b'10000000 |

Fig.18 (a)

| digital data to-be-compressed 151 | b'00000000 |
|---|---|
| number of continuous zeros 104 | 8 |
| "one" addition value 111 | 9 |
| number of bits of digital data 110 | 8 |
| number of bits to-be-allocated 105 | −1 |
| code 106 | |

Fig.18 (b)

| code 115 | |
|---|---|
| number of allocated bits 114 | −1 |
| difference | (9) |
| lower bits 116 | b'00000000 |
| decoded data 117 | b'00000000 |

METHOD AND APPARATUS FOR COMPRESSIVELY CODING/DECODING DIGITAL DATA TO REDUCE THE USE OF BAND-WIDTH OR STORAGE SPACE

FIELD OF THE INVENTION

The present invention relates to a method and an apparatus for compressively coding digital data, and a method and an apparatus for decoding coded data which is read from a recording medium in which the coded data is recorded or is transmitted through a transmission line, to provide reproduced data.

BACKGROUND OF THE INVENTION

In a current AV system, a signal is often handled as a digital signal. The digital signal is more resistive to noises around it than an analog signal, and is reproduced satisfactorily when transmitted or recorded in a recording medium such as a CD (compact disc) or a DVD (digital video disc). When the digital data is stored in the recording medium or transmitted, in order to make it possible to store or transmit enormous amount of data, it is compressed. MPEG (Moving Picture Experts Group) is established as a standardization group for a compression technique. Among MPEG standards, MPEG1 and MPEG2 have been standardized as a compression method for a moving picture and MPEG-Audio has been standardized as a compression method for audio.

Hereinafter, conception of the compression technique for audio data according to MPEG-Audio standard or the like, will be described.

FIG. 19 is a block diagram showing a stereo using a compression and decompression technique for the digital audio data.

The stereo shown in FIG. 19 comprises a compression section 120 for compressing the digital audio data, and a decompression section 125 for restoring digital audio data from compressed data.

The compression section 120 comprises a band division (sub-band creating) unit 121, a psychoacoustic model 122, a bit allocation unit 123, and a bit stream generation unit 124. Since the digital audio data input to the compression section 120 is in a temporary domain, the band division unit 121 divides the digital audio data into sub-band data to transform it into digital data 151 in a frequency domain and outputs the digital data 151 to the psychoacoustic model 122 and the bit allocation unit 123. The psychoacoustic model 122 has a model showing a minimum level of audio perceived by human auditory sense, which generally employs a minimum audible limit on stillness or a masking characteristic relating to a background noise and the like. The psychoacoustic model 122 determines the number of bits to-be-allocated 152 of the digital data 151 with quantization precision of a masking level set considering a critical band according to the psychoacoustic model, and outputs the number of bits to-be-allocated 152 to the bit allocation unit 123. The bit allocation unit 123 performs bit allocation starting from an MSB (most significant bit) of the digital data 151 according to the number of bits to-be-allocated 152, thereby compressively coding the digital data 151. The resulting compressed data 103 and the number of allocated bits 152 are output from the bit allocation unit 123 to the bit stream generation unit 124. The bit stream generation unit 124 multiplexes the compressed data 103 and the number of allocated bits 152 to generate a bit stream, and records the bit stream in a storage medium.

When the stereo is used in a digital music broadcast apparatus, the bit stream can be sent to a channel such as the Internet.

The decompression section 125 comprises a bit stream decomposition unit 126, a bit decompression unit 127, and a band composition unit 128. The bit stream decomposition unit 126 decomposes the bit stream input to the decompression section 125 through the storage medium (channel) into compressed data 203 and a number of allocated bits 162, which are output to the bit decompression unit 127. The bit decompression unit 127 calculates a bit length of bits omitted by masking, from the number of bits of the digital data 151 and the number of allocated bits 162, generates data of the bit length, and couples the data to lower bits of the compressed data 203. The bit decompression unit 127 couples the bits omitted by the compression unit 120 to the lower bits of the compressed data 203, resulting in bit-decompressed digital data 161 of an original length. Since the bit-decompressed digital data 161 is data in the frequency domain, the band composition unit 128 transforms this data into data in the temporary domain, to restore original digital audio data.

Subsequently, compression and decompression operations of the digital audio data by the stereo will be described. Here it is assumed that "b'" is added before binary numbers in numeric representation.

In the compression section 120, the band division unit 121 divides the digital audio data in the temporary domain into sub-band data to transform it into the digital data 151 in the frequency domain. As an example of the digital data 151 output from the band division unit 121, "b' 10100100" of which the number of bits "8" is used. The number of bits "8" is predetermined as a fixed value. When the psychoacoustic model 122 decides that data transmission should be performed at a masking level of the number of bits "5", the bit allocation unit 123 allocates 5 bits starting from the MSB of the digital data 151 "b' 10100100", to create the compressed data 103 "b' 10100". The bit allocation unit 123 outputs the "b' 10100" as the compressed data 103 and "5" as the number of allocated bits 152 to the bit stream generation unit 124. The bit stream generation unit 124 multiplexes the compressed data 103 "b' 10100" and the number of allocated bits 152 "5", and records the bit stream in the storage medium such as the DVD.

Thus, in the compression section 120, the bit allocation unit 123 performs bit allocation of the digital data 151 to reduce the bits of the digital data 151 by unallocated bits, whereby the digital data 151 is compressed.

In the decompression section 125, the bit stream decomposition unit 126 decomposes the bit stream sent from the storage medium into the compressed data 203 "b' 101001", and the number of allocated bits 162 "5". In order to restore the digital data 151, the bit decompression unit 127 subtracts the number of allocated bits 162 "5" from the number of bits "8" of the digital data 151, to generate data "b' 000" of the number of bits "3" and couples the bits "b' 000", to a lower side of the compressed data 203 "b' 10100". The resulting bit-decompressed data 161 "b 10100000" is output from the bit decompression unit 127. Although the bit-decompressed data 161 "b' 10100000" is different from the digital data 151 "b' 10100100", difference between them is within an error which is hard for human ears to hear, and it is therefore assumed that these two signals are the same in practice. The digital data 161 output from the bit decompression unit 127 is transformed from data in the frequency domain into data in the temporary domain by the band composition unit 128, to restore the digital audio data.

Thus, in the decompression section 125, the bit decompression unit 127 couples omitted bits to the lower bits of the compressed data 203, whereby the bit-decompressed digital data 161 of the original length is obtained.

Further, since storage capacities of the storage media or communication capacities of channels are limited, there is a need for an improved compression technique as data capacities increase. In particular, as for the compression technique for the digital audio data, there is a need for a technique which further increases the compression ratio without degrading the audio quality.

However, using the conventional compression technique, like the stereo, it is impossible to encode the digital data 151 with bits fewer than the bits of the number of bits to-be-allocated 152 which is determined by the psychoacoustic model 122.

SUMMARY OF THE INVENTION

The present invention is directed to solving the above-mentioned problem, and an object of the present invention is to provide a coding apparatus and a coding method which perform a coding process for data coded according to the prior art so that it is represented by fewer bits without degrading its precision, and decoding apparatus and a decoding method which decode such coded data.

Other objects and advantages of the invention will become apparent from the detailed description that follows. The detailed description and specific embodiments described are provided only for illustration since various additions and modifications within the spirit and scope of the invention will be apparent to those skill in the art from the detailed description.

According to a first aspect of the present invention, a coding apparatus which receives digital data as an input, creates a code obtained by coding the digital data, and outputs the code is disclosed. The coding apparatus comprises: detection means for detecting a number of continuous values, which detects either a number of continuous zeroes or a number of continuous ones from a first endmost bit of the digital data; calculation means for calculating a number of bits to-be-allocated, which subtracts an addition value obtained by adding the number of continuous values detected by the detection means and one, from a number of bits of the digital data, to obtain the number of bits to-be-allocated for the digital data; and bit allocation means which allocates bits to the digital data starting from a second endmost bit of the digital data which is opposite to the first endmost bit from which the number of continuous values is detected, according to the number of bits to-be-allocated calculated by the calculation means, to create a code composed of the allocated bits. Therefore, digital data compressed according to a psychoacoustic model and the like can be represented as fewer bits. When bits of digital data to-be-coded have the same values or bits other than an endmost bit have the same values, the number of allocated bits is smaller than "1", and therefore bit allocation is not performed and the code is not output. Since the number of bits to-be-allocated is used by the conventional apparatus, this number results in no increase in the data capacity. As a consequence, the digital data can be further compressed.

According to a second aspect of the present invention, in the coding apparatus of the first aspect, the calculation means outputs a given value as the number of bits to-be-allocated when the number of continuous values detected by the detection means is equal to the number of bits of the digital data, and the bit allocation means does not allocate the bits to the digital data and does not output the code when the calculation means outputs the given value. Therefore, when bits of digital data to-be-coded have the same values or bits other than an endmost bit have the same value, bit allocation is not performed and the code is not output. By using a given value as the number of allocated bits, it is easily decided whether the digital data is data whose bits have the same values or data whose bits other than the endmost bit have the same values.

According to a third aspect of the present invention, a decoding apparatus which decodes a code which is obtained by omitting bits of an addition value obtained by adding either a number of continuous zeros or a number of continuous ones as a number of continuous values from a first endmost bit of digital data and one, and coding the digital data, to restore the digital data is disclosed. The decoding apparatus comprises: bit generation means for generating bits which are as large as bits of a number obtained by subtracting a number of allocated bits corresponding to a number of bits of the code from a number of bits of the digital data and are arranged such that a second endmost bit has a value different from the continuous values and bits other than the second endmost bit have values equal to the continuous values; and coupling means for coupling the bits generated by the bit generation means to the code such that the second endmost bit of the bits generated by the bit generation means is coupled to a side of the code on which the bits have been omitted, to restore the digtial data. Therefore, the original digital data is restored by a decoding process without degrading its precision.

According to a fourth aspect of the present invention, in the decoding apparatus of the third aspect, the bit generation means generates bits which are as large as the bits of the digital data and have values equal to the continuous values when a given value is input as the number of allocated bits. Therefore, when bits of digital data to-be-coded have the same values or bits other than an endmost bit have the same value, bit allocation is not performed and the code is not output. By using a given value as the number of allocated bits, it is easily decided whether the digital data is data comprising bits having the same values or data whose bits other than the endmost bit have the same values. As a consequence, original digital data can be restored correctly.

According to a fifth aspect of the present invention, a coding method for compressing digital data is disclosed. The coding method comprises: a first step for detecting either a number of continuous zeros or a number of continuous ones from a first endmost bit of the digital data; and a second step for subtracting an addition value obtained by adding the number detected in the first step and one from a number of bits of the digital data, to obtain a number of bits to-be-allocated to the digital data; and a third step for allocating bits starting from a second endmost bit of the digital data which is opposite to the first endmost bit, according to the number of bits to-be-allocated obtained in the second step, to create a code comprising the allocated bits. Therefore, the effects of the first aspect can be achieved.

According to a sixth aspect of the present invention, in the coding method of the fifth aspect, when the number detected in the first step is equal to the number of bits of the digital data, a given value is output in the second step, and the bits are not allocated to the digital data and thereby the code is not output in the third step. Therefore, the effects of the second aspect can be achieved.

According to a seventh aspect of the present invention, a decoding method for decoding a code which is obtained by omitting bits of an addition value obtained by adding either a number of continuous zeros or a number of continuous ones as a number of continuous values from a first endmost bit of digital data and one, and coding the digital data, to restore the digital data is disclosed. The decoding method comprises: a first step for subtracting a number of allocated bits corresponding to a number of bits of the code from a number of bits of the digital data, to obtain a difference; a second step for generating bits which are as large as the difference obtained in the first step and are arranged such that a second endmost bit has a value different from the continuous values and bits other than the second endmost bit have values and bits other than the second endmost bit have values equal to the continuous values; and a third step for coupling the bits generated in the second step to the code such that the second endmost bit of the bits generated in the second step is coupled to a side of the code on which the bits have been omitted, to restore the digital data. Therefore, the effects of the third aspect can be achieved.

According to an eighth aspect of the present invention, the decoding method of the seventh aspect further comprises: a step for deciding whether or not the number of allocated bits is a given value, wherein when it is decided that the number of allocated bits is the given value, bits as large as bits of the digital data and having values equal to the continuous values are generated, to restore the digital data. Therefore, the effects of the fourth aspect can be achieved.

BRIEF DESCRIPTION OF THE DRAWINGS

FIGS. 5(a) and 5(b) are diagrams showing data tables in Operation 1 of the first embodiment.

FIGS. 6(a) and 6(b) are diagrams showing data tables in Operation 2 of the first embodiment.

FIGS. 7(a) and 7(b) are diagrams showing data tables in Operation 3 of the first embodiment.

FIGS. 8(a) and 8(b) are diagrams showing data tables in Operation 4 of the first embodiment.

FIGS. 11(a) and 11(b) are diagrams showing data tables in Operation 1 of the second embodiment.

FIGS. 12(a) and 12(b) are diagrams showing data tables in Operation 2 of the second embodiment.

FIGS. 13(a) and 13(b) are diagrams showing data tables in Operation 3 of the second embodiment.

FIGS. 14(a) and 14(b) are diagrams showing data tables in Operation 4 of the second embodiment.

FIGS. 15(a) and 15(b) are diagrams showing data tables in Operation 1 of a third embodiment.

FIGS. 16(a) and 16(b) are diagrams showing data tables in Operation 2 of the third bodiment.

FIGS. 17(a) and 17(b) are diagrams showing data tables in Operation 3 of the this embodiment.

FIGS. 18(a) and 18(b) are diagrams showing data tables in Operation 4 of the third embodiment.

DETAILED DESCRIPTION OF THE PREFERRED EMBODIMENTS

Now, preferred embodiments of the present invention will be described with reference to figures. Here it is assumed that "b'" is added before binary numbers and nothing is added before decimal numbers in numeric representation. By way of example, "10" given in decimal representation is represented as "b' 1010" in binary representation. Embodiment 1.

In the first embodiment, there is shown a case where compression and decompression techniques according to coding and decoding apparatuses and coding and decoding methods of the present invention are applied to a stereo.

Figure 1:
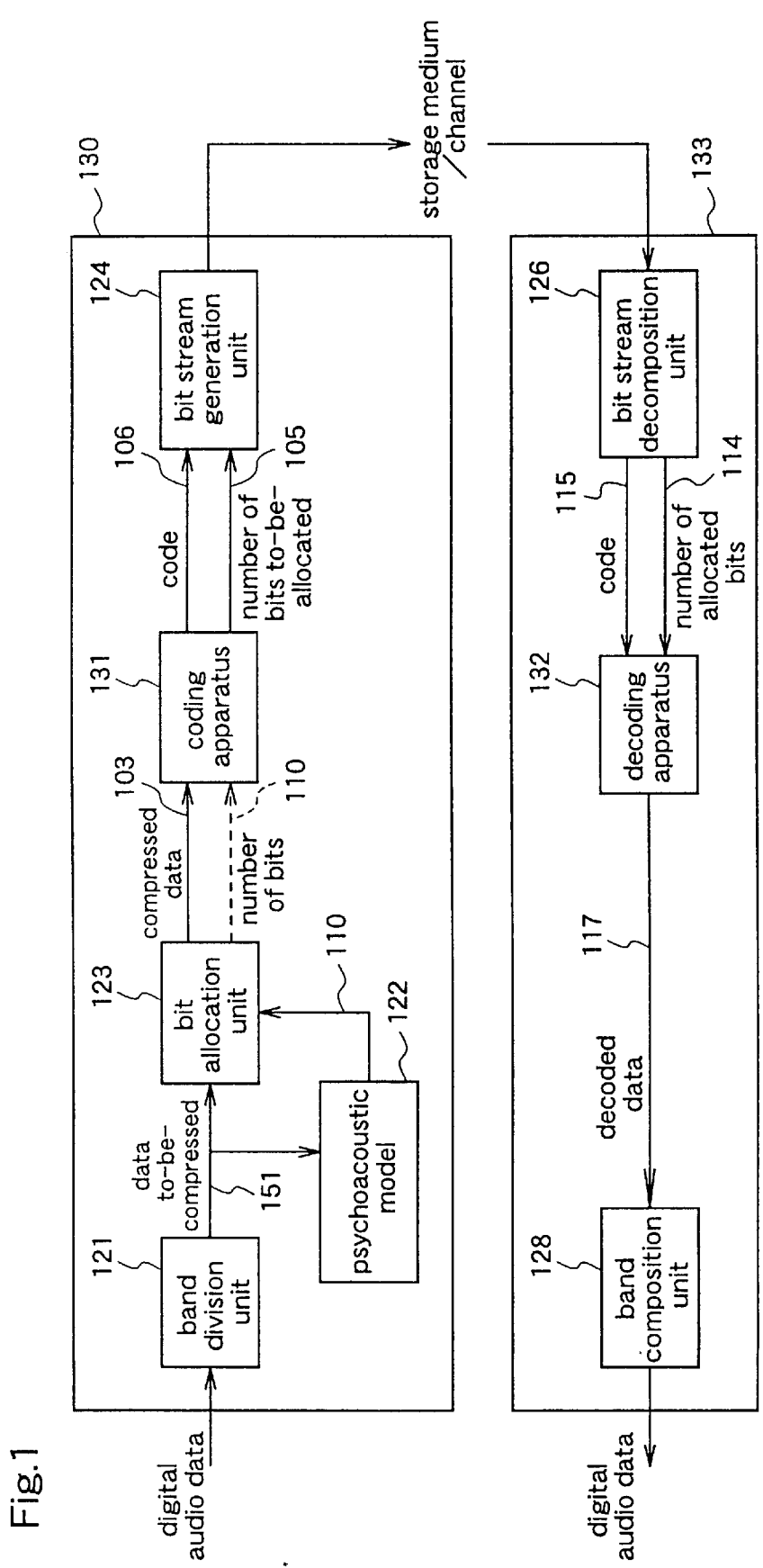
FIG. 1 is a block diagram showing a structure of a stereo to which coding and decoding apparatuses of the present invention are applied.

FIG. 1 is a block diagram showing a stereo according to a first embodiment of the present invention.

Turning now to FIG. 1, the stereo shown in FIG. 1 comprises a compression section 130 for compressing digital audio data and a decompression section 133 for decompressing compressed data to restore the digital audio data.

The compression section 130 comprises a band division unit 121, a psychoacoustic model 122, a bit allocation unit 123, a coding apparatus 131, and a bit stream generation unit 124. The constructions of the band division unit 121, the psychoacoustic model 122, the bit allocation unit 123, and the bit stream generation unit 124 are identical to those of the conventional stereo shown in FIG. 19, and therefore will not be discussed therein.

The coding apparatus 131 encodes digital data 103 output from the bit allocation unit 123. The resulting code always has a data length shorter than that of the digital data 103 output from the bit allocation unit 123.

Figure 2:
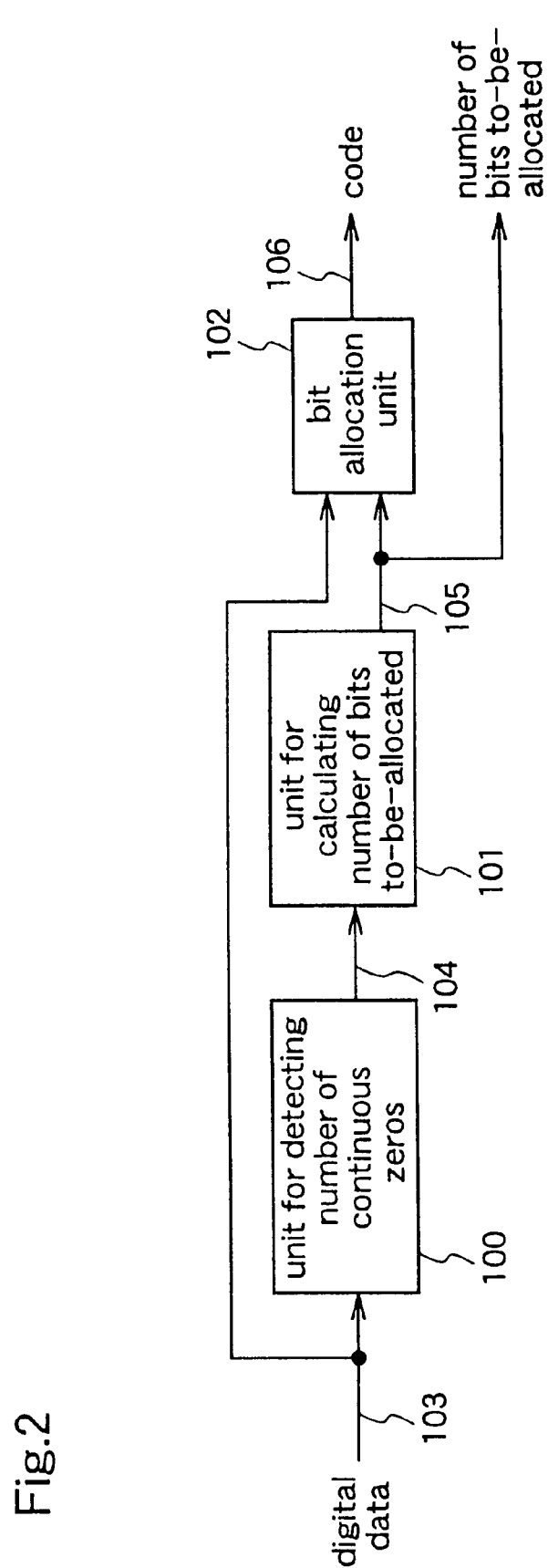
FIG. 2 is a block diagram showing a structure of a coding apparatus 131 shown in FIG. 1.
Figure 3:
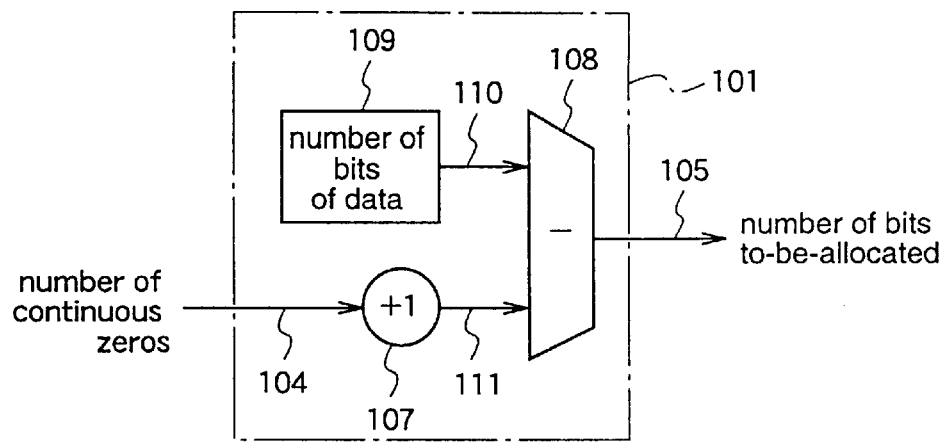
FIG. 3 is a block diagram showing a structure of a unit for calculating the number of bits to-be-allocated 101 shown in FIG. 2.

FIG. 2 is a block diagram showing a structure of the coding apparatus 131. FIG. 3 is a block diagram showing a structure of a unit for calculating the number of bits to-be-allocated 101 shown in FIG. 2.

Turning now to FIG. 2, the coding apparatus 131 comprises a unit for detecting the number of continuous zeros (detection unit) 100, a unit for calculating the number of bits to-be-allocated (calculation unit) 101, and a bit allocation unit 102.

The detection unit 100 functions as means for detecting the number of continuous zeros, which outputs the number of continuous "b' 0" from an LSB (least significant bit) of the digital data 103.

The calculation unit 101 functions as means for calculating the number of bits to-be-allocated. When the number of continuous zeros detected by the detection unit 100 is equal to a value of a bit length of the digital data 103, the calculation unit 101 outputs a given value "−1", or otherwise, it outputs a value obtained by subtracting the number of continuous zeros detected by the detection means 100 plus "1" from the value of the bit length of the digital data 103.

Turning now to FIG. 3, the calculation unit 101 comprises a "one" adder 107, a subtracter 108, and an output unit 109 for outputting the number of bits. The "one" adder 107 adds "1" to an output value 104 of the detection means 100. The output unit 109 outputs a number of bits 110 of the digital data 103. The subtracter 108 outputs a value obtained by subtracting an output value 111 of the "one" adder 107 from the value of the bit length 110 output from the output unit 109, as the number of bits to-be-allocated 105.

Since the value 111 obtained by subtracting the output value 104 of the detection unit 100 plus "1" from the value of the bit length 110 output from the output unit 109 is the number of bits to-be-allocated 105, the number of bits to-be-allocated 105 is always smaller than the value 110 of the bit length output from the output unit 109, irrespective of the output value 104 of the detection unit 100.

The bit allocation unit 102 functions as bit allocation means, which outputs a code 106 obtained by hit allocation starting from the MSB of the digital data 103 according to the number of bits to-be-allocated 105 calculated by the calculation means 101. When the value output from the calculation means 101 is the given value "−1" or "0", the bit allocation unit 102 does not perform bit allocation to the digital data 103, and does not output a code.

As the number of bits of the digital data 103 handled by the coding apparatus 131, the number of bits 110 output from the bit allocation unit 123 is used. The bit stream generation unit 124 multiplexes the code 106 and the number of bits to-be-allocated (allocated bits) 105 output from the coding apparatus 131 into a bit stream.

The bit stream can be compressed in a more appropriate way.

Turning to FIG. 1 again, the decompression section 133 of the first embodiment comprises a bit stream decomposition unit 126, a decoding apparatus 132, and a band composition unit 128. The constructions of the bit stream decomposition unit 126 and the band composition unit 128 are identical to those of the stereo shown in FIG. 19, and therefore will not be discussed herein.

Figure 4:
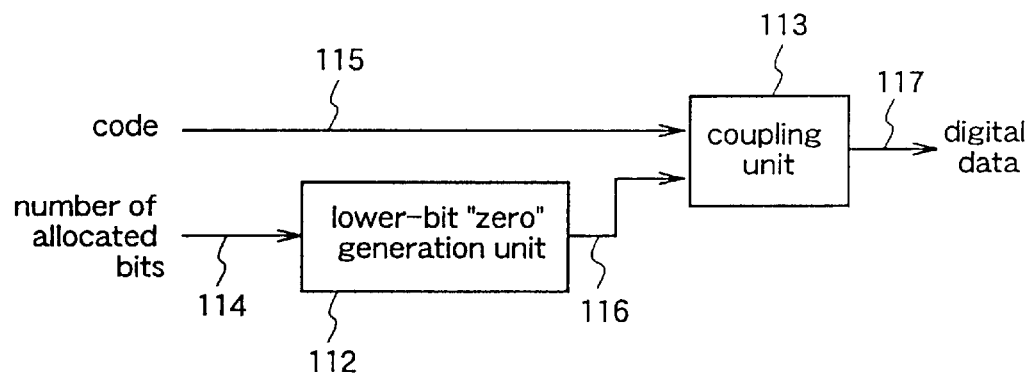
FIG. 4 is a block diagram showing a structure of a decoding apparatus 132 shown in FIG. 1.

FIG. 4 is a block diagram showing a structure of the decoding apparatus 132.

Turning to FIG. 4, the decoding apparatus 132 comprises a lower-bit "zero" generation unit 112, and a coupling unit 113. The lower-bit "zero" generation unit 112 functions as bit generation means. When a number of allocated bits 114 is the given value "−1", the generation means 112 outputs a number of bits 116 each having a value "b' 0", the number of bits 116 being equal to the number of the bits of the digital data 151. On the other hand, when a difference between the number of bits of the original data 151 and the number of allocated bits 114 is "1", the generation unit 112 outputs a bit 116 having a value "b' 1", and further, when the difference between them is 2 or more, the generation unit 112 outputs a number of bits 116 which is the same as the difference and the bits are represented as "b' 1" (MSB) and "b' 0" (bits other than MSB). The coupling unit 113 functions as coupling means, which couples the bits 116 output from the generation unit 112 to a lower side of a code 115 and outputs the resulting data. When the code 115 is not included in the bit stream, the coupling unit 113 outputs the bits 116 generated by the generation means 112.

A description will be given of compression and decompression operation performed by the coding apparatus 131 and decoding apparatus 132, respectively, in the stereo of the first embodiment.

FIGS. 5(a)–5(b) through 8(a)–8(b) show tables which contain data handled by the first embodiment. In these figures, FIGS.(a) show data tables used by the coding apparatus 131 and FIGS.(b) show data tables used by the decoding apparatus 132. In this embodiment, it is assumed that the bit length of the digital data to be coded is fixed as "8".

(Operation 1)

Operation 1 shows compression and decompression operations for digital data 151 "b' 01010010".

Figure 19:
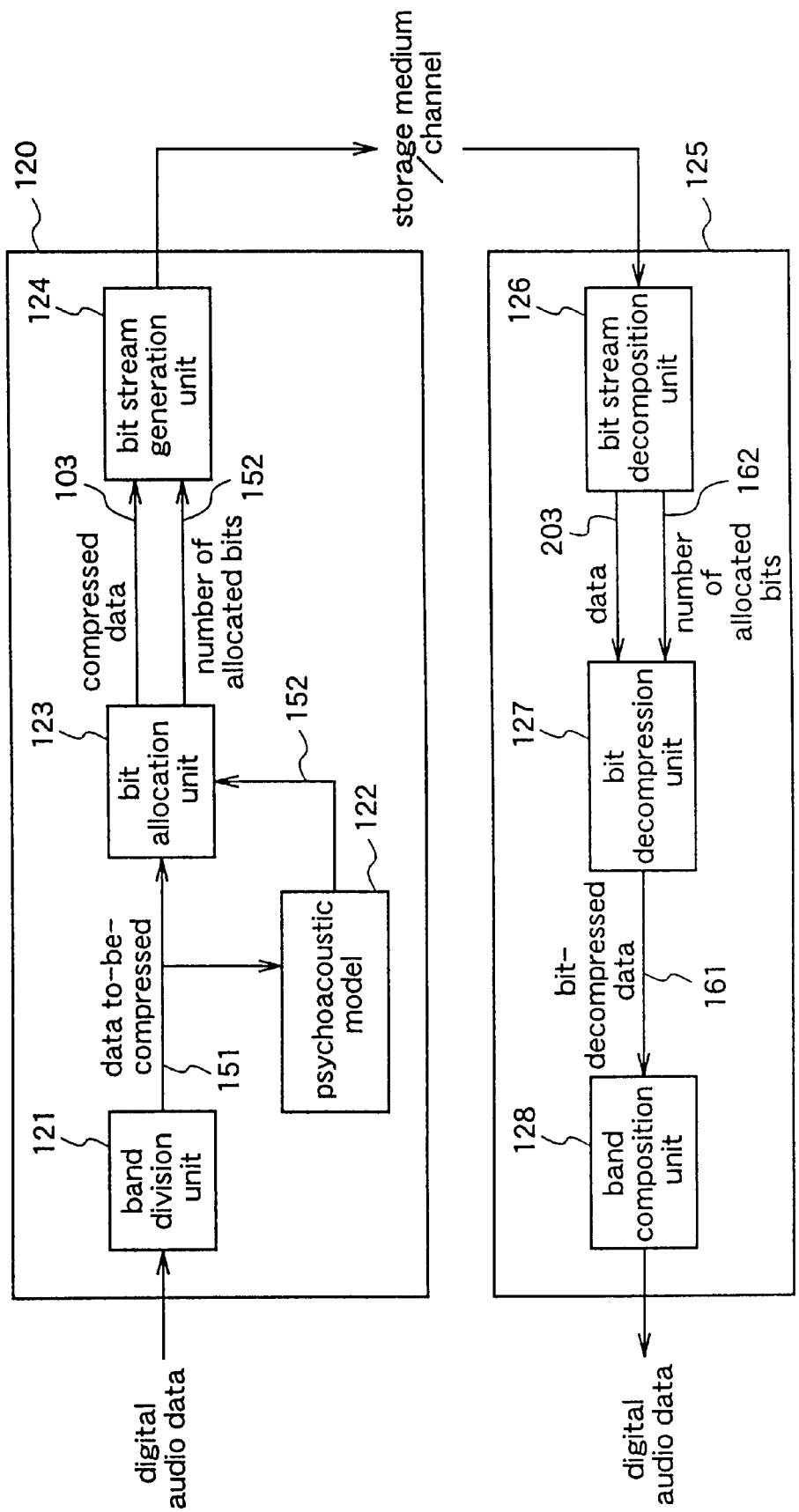
FIG. 19 is a block diagram showing a stereo using conventional coding and decoding apparatuses.

With reference to FIG. 5(a), when the digital audio data is input to compression section 130, like the conventional example shown in FIG. 19, the psychoacoustic model 122 decides that the digital data 151 "b' 01010010" output from the band division unit 121 should be transmitted at a masking level of the number of bits "5", and the bit allocation unit 123 outputs the compressed digital data 103 "b' 01010".

The digital data 103 "b'01010" is input to the coding apparatus 131. The detection means 100 counts the number of continuous zeros from the LSB of the "b' 01010" and outputs "1" as the number 104, to the "one" adder 107, which adds 1 to the "1" and outputs "2" as an addition value 111. The number of bits 110 of the digital data 103 to be coded is the number of bits-to-be-allocated "5" which is determined by the psychoacoustic model 122, and the number from the "one" adder 107 is "2", the subtracter 108 performs "5−2=3" and outputs "3" as the number of bits to-be-allocated to the bit allocation unit 102. The bit allocation unit 102 allocates 3 bits starting from the MSB of the "b' 01010" of the digital data 103 and outputs "b' 010" as the code 106 to the bit stream generation unit 124. The bit stream generation unit 124 multiplexes the code 106 "b' 010" and the number of bits to-be-allocated (allocated bits) 105 "3", into a bit stream, which is sent to the storage medium and the like.

With reference to FIG. 5(b), when the bit stream is sent from the storage medium to the decompression section 133, the bit stream decomposition unit 126 decomposes the bit stream into the code "b' 010" and the number of allocated bits 114 "3".

The code 115 "b' 010" and the number of allocated bits 114 "3" are input to the decoding apparatus 132. Since the number "3" is input as the number of allocated bits 114, and difference between the number "3" and the bit length of the digital data 151 "8" is "8−3=5", which is within a range of "2 or more", the lower-bit "zero" generation unit 112 outputs lower bits 116 having a 5-bit length which are represented as "b' 10000" (MSB="b' 1" and bits other than MSB="b' 0000"). The coupling unit 113 couples the lower bits 116 "b' 10000" to a lower side of the code 115 "b' 010", and outputs "b' 01010000" as decoded data 117. The band composition unit 128 transforms the digital data 117 output from the decoding apparatus 132 from data in the frequency domain into data in the temporary domain, to restore the original digital audio data.

Comparing the decoded data 117 "b' 01010000" to the uncompressed digital data 151 "b' 01010010", they are partially different, although this difference is the error generated by the conventional apparatus shown in FIG. 19, that is, the error which is hard for human ears to hear, and therefore, the decoded data 117 and the digital data 151 are assumed to be the same signals in practice.

Although in the conventional apparatus, the bit allocation unit 123 compresses the 8-bit digital data into the 5-bit data and outputs the 5-bit data, in this illustrated example, the coding apparatus 131 is capable of compressing the 5-bit data by 2 bits into the 3-bit code, resulting in a further increased compression ratio. It should be remembered that information of the number of bits to-be-allocated 105 results in no increase in a data capacity because this is also necessary for the conventional apparatus.

In accordance with the decoding apparatus 132 of the decompression section 133 of the first embodiment, the original digital audio data is restored with precision as high as that of the conventional apparatus.

(Operation 2)

Operation 2 shows compression and decompression operation for digital data 151 "b' 11011000".

With reference to FIG. 6(*a*), when the digital audio data is input to the compression section 130, like the conventional example shown in FIG. 19, the psychoacoustic model 122 decides that digital data 151 "b' 11011000" output from the band division unit 121 should be transmitted at a masking level of the number of bits "5", and the bit allocation unit 123 outputs compressed digital data 103 "b' 11011".

The digital data 103 "b' 11011" is input to the coding apparatus 131. The detection unit 100 counts the number of continuous zeros from the LSB of the "b' 11011" and outputs "0" as the number of continuous zeros 104, to the "one" adder 107, which adds 1 to the "0" and outputs "1" as the addition value 111. The number of bits 110 of the digital data 103 to be coded is the number of bits-to-be-allocated "5" which is determined by the psychoacoustic model 122, and the number from the "one" adder 107 is "1", the subtracter 108 performs "5−1=4" and outputs "4" as the number of bits to-be-allocated 105 to the bit allocation unit 102. The bit allocation unit 102 allocates 4 bits starting from the MSB of the "b' 11011" of the digital data 103 and outputs "b' 1101" as the code 106. The bit stream generation unit 124 multiplexes the code 106 "b' 1101" and the number of bits to-be-allocated (allocated bits) 105 "4" into a bit stream, which is sent to the storage medium and the like.

With reference to FIG. 6(*b*), when the bit stream is sent through the storage medium to the decompression section 133, the bit stream decomposition unit 126 decomposes the bit stream into the code "b' 1101" and a number of allocated bits 114 "4".

The code 115 "b' 1101" and the number of allocated bits 114 "4" are input to the decoding apparatus 132. Since the number "4" is input as the number of allocated bits 114, and difference between the number "4" and the bit length of the digital data 151 "8" is "8−4=4", which is within the range of "2 or more", the lower-bit "zero", generation unit 112 outputs the lower bits 116 having a 4-bit length which are represented as "b' 1000" (MSB="b' 1" and bits other than MSB ="b' 000"). The coupling unit 113 couples the lower bits 116 "b' 1000" to a lower side of the code 115 "b' 1101", and outputs "b' 11011000" as decoded data 117. The band composition unit 128 transforms the digital data 117 output from the decoding apparatus 132 from data in the frequency domain into data in the temporary domain, to restore the original digital audio data.

The decoded data 117 "b' 11011000" is identical to the digital data 151 "b' 11011000", as is apparent from comparison between them.

Although in the conventional apparatus, the bit allocation unit 123 compresses the 8-bit digital data into the 5-bit data and outputs the 5-bit data, in this illustrated example, the coding apparatus 131 is capable of compressing the 5-bit data by 1 bit into the 4-bit code, resulting in a higher compression ratio. It should be remembered that information of the number of bits to-be-allocated 105 results in no increase in a data capacity because this is also necessary for the conventional apparatus.

In accordance with the decoding apparatus 132 of the decompression section 133 of the first embodiment, the original digital audio data is restored with precision as high as that of the conventional apparatus.

(Operation 3)

Operation 3 shows compression and decompression operation for digital data 151 "b' 10000000".

With reference to FIG. 7(*a*), when the digital audio data is input to the compression section 130, like the conventional example shown in FIG. 19, the psychoacoustic model 122 decides that the digital data 151 "b' 10000000" output from the band division unit 121 should be transmitted at a masking level of the number of bits "5", and the bit allocation unit 123 outputs compressed digital data 103 "b' 10000".

The digital data 103 "b' 10000" is input to the coding apparatus 131. The detection means 100 counts the number of continuous zeros from the LSB of the b' 10000" and outputs "4" as the number 104, to the "one" adder 107, which adds 1 to the "4" and outputs "5" as an addition value 111. The number of bits 110 of the digital data 103 to be coded is the number of bits-to-be-allocated "5" which is determined by the psychoacoustic model 122, and the number output from the "one" adder 107 is "5", the subtracter 108 performs "5−5=0" and outputs "0" as the number of bits to-be-allocated 105 to the bit allocation unit 102. The bit allocation unit 102 does not perform bit allocation for the digital data 103 "b' 10000", because the number of bits to-be-allocated 105 "0" is input thereto from the calculation unit 101. Therefore, the code 106 is not output. The bit stream generation unit 124 sends the number of bits to-be-allocated (allocated bits) 105 "0" as the bit stream to the storage medium and the like.

With reference to FIG. 7(*b*), when the bit stream is sent through the storage medium to the decompression section 133, the bit stream decomposition unit 126 takes out and outputs a number of allocated bits 114 "0".

The number of allocated bits 114 "0" is input to the decoding apparatus 132. Since the number "0" is input as the number of allocated bits 114, and difference between the number "0" and the bit length of the digital data 151 "8" is "8−0=8", which is within the range of "2 or more", the lower-bit "zero" generation unit 112 outputs lower bits 116 having an 8-bit length which are represented as "b' 10000000" (MSB="b' 1" and bits other than MSB="b' 0000000"). The coupling unit 113 outputs "b' 10000000" as decoded data 117. The band composition unit 128 transforms the digital data 117 output from the decoding apparatus 132 from data in the frequency domain into data in the temporary domain, to restore the original digital audio data.

The decoded data 117 "b' 10000000" is identical to the digital data 151 "b' 10000000", as is apparent from comparison between them.

Although in the conventional apparatus, the bit allocation unit 123 compresses the 8-bit digital data into the 5-bit data and outputs the 5-bit data, in this illustrated example, the coding apparatus 131 is capable of omitting all bits. Thereby, a data capacity of "no bits" is achieved. It should be remembered that information of the number of bits to-be-allocated 105 results in no increase in the data capacity because this is also necessary for the conventional apparatus.

In accordance with the decoding apparatus 132 of the decompression section 133 of the first embodiment, the original digital data is restored with precision as high as that of the conventional apparatus. Therefore, in this Operation 3, it is obvious that the original digital audio data can be restored without degrading its precision if the data compressed by the conventional apparatus is entirely omitted.

(Operation 4)

Operation 4 shows compression and decompression operation for digital data 151 "b' 00000000".

With reference to FIG. 8(a), when the digital audio data is input to the compression section 130, like the conventional example shown in FIG. 19, the psychoacoustic model 122 decides that the digital data 151 "b' 00000000" output from the band division unit 121 should be transmitted at a masking level of the number of bits "5", and the bit allocation unit 123 outputs compressed digital data 103 "b' 00000".

The digital data 103 "b' 00000" is input to the coding apparatus 131. The detection unit 100 counts the number of continuous zeros from the LSB of the "b' 00000" and outputs "5" as the number of continuous zeros 104, to the "one" adder 107, which adds 1 to the "5" and outputs "6" as the addition value 111. The number of bits 110 of the digital data 103 to be coded is the number of bits-to-be-allocated "5" which is determined by the psychoacoustic model 122, and the number from the "one" adder 107 is "6", the subtracter 108 performs "5−6=−1" and outputs "−1" as the number of bits to-be-allocated to the bit allocation unit 102. The bit allocation unit 102 does not perform bit allocation for the digital data 103 "b' 000000", since the "−1" is input thereto from the calculation unit 101. Therefore, the code 106 is not output. The bit stream generation means 124 sends the number of bits to-be-allocated (allocated bits) 105 as the bit stream to the storage medium and the like.

With reference to FIG. 8(b), the bit stream is sent through the storage medium to the decompression section 133. The bit stream decomposition unit 126 takes out and outputs the number of allocated bits 114 "−1".

The number of allocated bits 114 "−1" is input to the decoding apparatus 132. Since the number "−1" is input as the number of allocated bits 114, the lower-bit "zero" generation unit 112 outputs lower bits 116 having a 8-bit length as large as that of the digital data 151, which are represented as "b' 00000000". The coupling unit 113 outputs the lower bits 116 "b' 00000000" as decoded data 117. The band composition unit 128 transforms the digital data 117 output from the decoding apparatus 132 from data in the frequency domain into data in the temporary domain, to restore the original audio data.

The decoded data 117 "b' 00000000", is identical to the digital data 151 "b' 00000000", as is apparent from comparison between them.

Although in the conventional apparatus, the bit allocation unit 123 compresses the 8-bit digital data into the 5-bit data and outputs the 5-bit data, in this illustrated example, the coding apparatus 131 is capable of omitting all bits. Thereby, a data capacity of "no bits" is achieved. It should be remembered that information of the number of bits to-be-allocated 105 results in no increase in the data capacity because this is also necessary for the conventional apparatus.

In accordance with the decoding apparatus 132 of the decompression section 133 of the first embodiment, the original digital data is restored with precision as high as that of the conventional apparatus. Therefore, in this Operation 4, it is obvious that the original digital audio data can be restored without degrading its precision if the data compressed by the conventional apparatus is entirely omitted.

Thus, in accordance with the coding apparatus 131 of the first embodiment, the code 106 obtained by omitting lower bits of the number of continuous "b' 0" from the LSB plus "1" from the digital data 103 compressed according to the psychoacoustic model 122 is obtained, whereby the digital data 103 is represented as fewer bits. In addition, when all bits of the digital data 103 are represented as "b' 0" or the MSB of the digital data 103 is "b' 0" and the other bits thereof are "b' 0", the code 106 is not output. Further, as for the number of bits to-be-allocated 105 multiplexed into the bit stream, this corresponds to the number of bits to-be-allocated which is used in the conventional stereo shown in FIG. 19, and therefore, a data amount is not increased. As a consequence, the coding apparatus 131 can reduce the amount of digital data more than the conventional coding apparatus.

Furthermore, in accordance with the decoding apparatus 132 of the first embodiment, since the coding apparatus 131 omits the lower bits of the number of continuous "b' 0" from the LSB plus "1", the lower-bit "zero" generation unit 112 determines the number of omitted bits according to the number of allocated bits 114 and generates the lower bits 116 which are of the same quantity as the omitted bits and are represented as (MSB="b' 1" and bits other than the MSB="b' 0"), and the coupling unit 113 couples the lower bits 116 to the lower side of the code 115. The original digital data is restored through a decoding process without degrading precision as much as that of the conventional apparatus.

Moreover, when the digital data 151 is "b' 10000000" or "b' 00000000", the number of allocated bits 114 input to the decoding apparatus 132 is "0" (Operation 3, FIGS. 7(a) and (b)) or the given value "−1" (Operation 4, FIGS. 8(a) and (b)), and therefore, the code 115 is not sent to the decoding apparatus 132 in these cases. In such cases, by using the given value "−1", whether the digital data 151 in which all bits have been omitted, is the "b' 10000000" or "b' 00000000" can be decided easily, and the lower bits 116 generated by the lower-bit "zero" generation unit 112 can be restored correctly as the original digital data 151 (decoded data 117).

Figure 9:
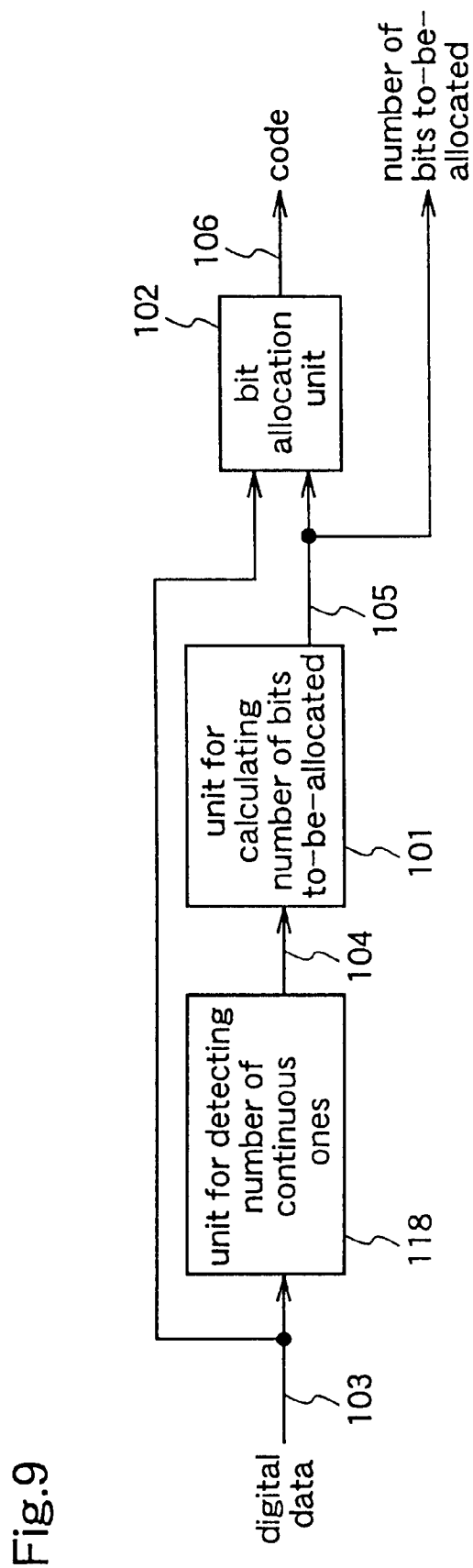
FIG. 9 is a block diagram showing a structure of a coding apparatus according to a second embodiment of the present invention.

In a coding apparatus included in a stereo according to a second embodiment, the unit for detecting the number of continuous zeros 100 of the first embodiment is, as shown in FIG. 9, replaced by a unit for detecting the number of continuous ones 118. The unit for detecting the number of continuous ones (detection means) 118 functions as means for detecting the number of continuous ones, which outputs the number of continuous "b' 1" from the LSB of the digital data 103. The construction of the other components are identical to those of the first shown in FIGS. 1 and 2.

Figure 10:
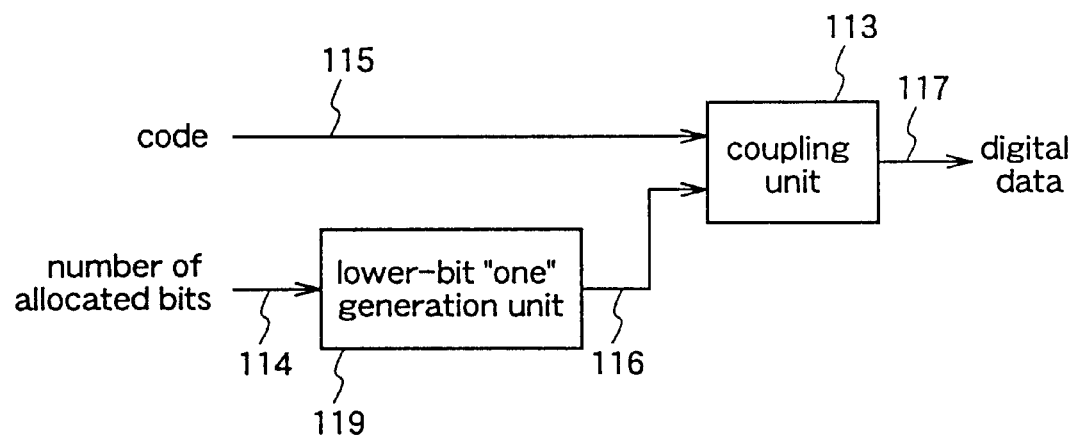
FIG. 10 is a block diagram showing a structure of a decoding apparatus of the second embodiment.

In a decoding apparatus included in the stereo according to the second embodiment, the lower-bit "zero" generation unit 112 of the first embodiment is, as shown in FIG. 10, replaced by a lower-bit "one" generation unit 119. The lower-bit "one" generation unit 119 functions as lower-bit generation means, which outputs a value of a bit length of the digital data 151 which comprises "b' 1" when the number of allocated bits is "−1", outputs a value of "b' 0" when difference between the number of bits of the digital data 151 and the number of allocated bits 114 is "1", and outputs a value of the difference which comprises the MSB "b' 0" and bits "b' 1" when the difference is 2 or more. The construction of the other components are identical to those of the first embodiment shown in FIGS. 1 and 4.

Operation of compression and decompression performed by the coding apparatus 131 and the decoding apparatus 132 according to the second embodiment will be described.

FIGS. 11(a)–11(b) through 14(a)–14(b) show data tables used in the second embodiment. In these figures, figures (a) show data table used by the coding apparatus 131 and figures (b) show data tables used by the decoding apparatus 132. In this embodiment, it is assumed that this bit length of the digital data 151 to be coded is fixed as "8".

(Operation 1)

Operation 1 shows compression and decompression operations for digital data 151 "b' 01000111".

With reference to FIG. 11(a), when the digital audio data is input to the compression section 130, like the conventional example shown in FIG. 19, the psychoacoustic model 122 decides that the digital data 151 "b' 01000111" output from the band division unit 121 should be transmitted at a masking level of the number of bits "5", and the bit allocation unit 123 outputs compressed digital data 103 "b' 01000".

The digital data 103 "b' 01000" is input to the coding apparatus 131. The detection means 118 counts the number of continuous ones from the LSB of the "b' 01000" and outputs "0" as the number of continuous ones 104, to the "one" adder 107, which adds 1 to the "0" and outputs "1" as the addition value 111. Since the number of bits 110 of the digital data 103 to be coded is the number of bits to-be-allocated "5" which is determined by the psychoacoustic model 122, and the number output from the "one" adder 107 is "1", the subtracter 108 performs "5−1=4" and outputs "4" as the number of bits to-be-allocated 105 to the bit allocation unit 102. The bit allocation unit 102 allocates 4 bits starting from the MSB of the "b' 01000" of the digital data 103 and outputs "b' 0100" as the code 106. The bit stream generation unit 124 multiplexes the code 106 "b' 0100" and the number of bits to-be-allocated (allocated bits) 105 "4" into the bit stream, which is sent to the storage medium and the like.

With reference to FIG. 11(b), when the bit stream is sent through the storage medium to the decompression section 133, the bit stream decomposition unit 126 decomposes the bit stream into the code 115 "b' 0100" and the number of allocated bits 114 "4".

The code 115 "b' 0100" and the number of allocated bits 114 "4" are input to the decoding apparatus 132. Since the number "4" is input as the number of allocated bits 114, and difference between the number "4" and the bit length of the digital data 151 "8" is "8−4=4", which is within the range of "2" or more", the lower-bit "one" generation unit 119 outputs lower bits 116 having a 4-bit length which are represented as "b' 0111" (MSB="b' 0" and bits other than MSB="b' 111"). The coupling unit 113 couples the lower bits 116 "b' 0111" to the lower side of the code 115 "b' 0100", and outputs "b' 01000111" as decoded data 117. The band composition unit 128 transforms the digital data 117 output from the decoding apparatus 132 from data in the frequency domain into data in the temporary domain, to restore the original audio data.

The decoded data 117 "b' 01000111" is identical to the digital data 151 "b' 01000111", as is apparent from comparison between them.

Although in the conventional apparatus, the bit allocation unit 123 compresses the 8-bit digital data into the 5-bit data and outputs the 5-bit data, in this illustrated example, the coding apparatus 131 of the second embodiment is capable of compressing the 5-bit data by 1 bit into the 4-bit code, resulting in a higher compression ratio. It should be remembered that information of the number of bits to-be-allocated 105 results in no increase in a data capacity because this is also necessary for the conventional apparatus.

In accordance with the decoding apparatus 132 of the decompression section 133 of the second embodiment, the original digital data is restored with precision as high as that of the conventional apparatus.

(Operation 2)

Operation 2 shows compression and decompression operation for digital data 151 "b' 11011111".

With reference to FIG. 12(a), when the digital audio data is input to compression section 130, like the conventional example shown in FIG. 19, the psychoacoustic model 122 decides that the digital data 151 "b' 11011111" output from the band division unit 121 should be transmitted at a masking level of the number of bits "5", and the bit allocation unit 123 outputs compressed digital data 103 "b' 11011".

The digital data 103 "b' 11011" is input to the coding apparatus 131. The detection unit 118 counts the number of continuous ones from the LSB of the "b' 11011" and outputs "2" as the number of continuous ones 104, to the "one" adder 107, which adds 1 to the "2" and outputs "3" as the addition value 111. The number of bits 110 of the digital data 103 to be coded is the number of bits to-be-allocated "5" which is determined by the psychoacoustic model 122, and the number from the "one" adder 107 is "3", the subtracter 108 performs "5−3=2" and outputs "2" as the number of bits to-be-allocated 105 to the bit allocation unit 102. The bit allocation unit 102 allocates 2 bits starting from the MSB of the "b' 11011" of the digital data 103 and outputs "b' 11" as the code 106. The bit stream generation unit 124 multiplexes the code 106 "b' 11" and the number of bits to-be-allocated (allocated bits) 105 "2" into a bit stream, which is sent to the storage medium and the like.

With reference to FIG. 12(b), when the bit stream is sent through the storage medium to the decompression section 133, the bit stream decomposition unit 126 decomposes the bit stream into the code 115 "b' 11" and the number of allocated bits 114 "2".

The code 115 "b' 11" and the number of allocated bits 114 "2" are input to the decoding apparatus 132. Since the number "2" is input as the number of allocated bits 114, and difference between the number "2" and the bit length of the digital data 151 "8" is "8−2=6", which is within the range of "2 or more", the lower-bit "one" generation unit 119 outputs lower bits 116 having a 6-bit length which are represented as "b' 011111" (MSB="b' 0" and bits other than MSB="b' 11111"). The coupling unit 113 couples the lower bits 116 "b' 011111"=0 to a lower side of the code 115 "b' 11", and outputs "b' 11011111" as decoded data 117. The band composition unit 128 transforms the digital data 117 output from the decoding apparatus 132 from data in the frequency domain into data in the temporary domain, to restore the original audio data.

The decoded data 117 "b' 11011111" is identical to the digital data 151 "b' 11011111", as is apparent from comparison between them.

Although in the conventional apparatus, the bit allocation unit 123 compresses the 8-bit digital data into the 5-bit data and outputs the 5-bit data, in this illustrated example, the coding apparatus 131 is capable of compressing the 5-bit data by 3 bits into the 2-bit code, resulting in a higher compression ratio. It should be remembered that information of the number of bits to-be-allocated 105 results in no increase in a data capacity because this is also necessary for the conventional apparatus.

In accordance with the decoding apparatus 132 of the decompression section 133 of the second embodiment, the original digital data is restored with precision as high as that of the conventional apparatus.

(Operation 3)

Operation 3 shows compression and decompression operation for digital data 151 "b' 01111111".

With reference to FIG. 13(a), when the digital audio data is input to the compression section 130, like the conventional example shown in FIG. 19, the psychoacoustic model 122 decides that the digital data 151 "b' 01111111" output from the band division unit 121 should be transmitted at a masking level of the number of bits "5", and the bit allocation unit 123 outputs compressed digital data 103 "b' 01111".

The digital data 103 "b' 01111" is input to the coding apparatus 131. The detection means 118 counts the number of continuous ones from the LSB of the "b' 01111" and outputs "4" as the number of continuous ones 104, to the "one" adder 107, which adds 1 to the "4" and outputs "5" as the addition value 111. The number of bits 110 of the digital data 103 to be coded is the number of bits-to-be-allocated "5" which is determined by the psychoacoustic model 122, and the number output from the "one" adder 107 is "5", the subtracter 108 performs "5−5=0" and outputs "0" as the number of bits to-be-allocated 105 to the bit allocation unit 102. The bit allocation unit 102 does not perform bit allocation for the digital data 103 "b' 01111". Therefore, the code 106 is not output. The bit stream generation unit 124 sends the number of bits to-be-allocated (allocated bits) 105 "0" as the bit stream to the storage medium and the like.

With reference to FIG. 13(b), when the bit stream is sent through the storage medium to the decompression section 133, the bit stream decomposition unit 126 takes out and outputs a number of allocated bits 114 "0".

The number of allocated bits 114 "0" is input to the decoding apparatus 132. Since the number "0" is input as the number of allocated bits 114, and difference between the number "0" and the bit length of the digital data 151 "8" is "8−0=8", which is in the range of "2 or more", the lower-bit "one" generation unit 119 outputs lower bits 116 having an 8-bit length which are represented as "b' 01111111" (MSB="b' 0" and bits other than MSB="b' 1111111"). The coupling unit 113 outputs the lower bits 116 "b' 01111111" as decoded data 117, because there is no code 115. The band composition unit 128 transforms the digital data 117 output from the decoding apparatus 132 from data in the frequency domain into data in the temporary domain, to restore the original digital audio data.

The decoded data 117 "b' 01111111" is identical to the digital data 151 "b' 01111111", as is apparent from comparison between them.

Although in the conventional apparatus, the bit allocation unit 123 compresses the 8-bit digital data into the 5-bit data and outputs the 5-bit data, in this illustrated example, the coding apparatus 131 is capable of omitting all bits. Thereby, "no bits" occupy a data capacity. It should be remembered that information of the number of bits to-be-allocated 105 results in no increase in the data capacity because this is also necessary for the conventional apparatus.

In accordance with the decoding apparatus 132 of the decompression section 133 of the second embodiment, the original digital data is restored with precision as high as that of the conventional apparatus. Therefore, in this operation 3, it is obvious that the original digital audio data can be restored without degrading its precision if the data compressed by the conventional apparatus is entirely omitted.

(Operation 4)

Operation 4 shows compression and decompression for digital data 151 "b' 11111111".

With reference to FIG. 14(a), when the digital audio data is input to the compression section 130, like the conventional example shown in FIG. 19, the psychoacoustic model 122 decides that the digital data 151 "b' 11111111" output from the band division unit 121 should be transmitted at a masking level of the number of bits "5", and the bit allocation unit 123 outputs compressed digital data 103 "b' 11111".

The digital data 103 "b' 11111" is input to the coding apparatus 131. The detection unit 118 counts the number of continuous ones from the LSB of the "b' 11111" and outputs "5" as the number of continuous ones 104, to the "one" adder 107, which adds 1 to the "5" and outputs "6" as the addition value 111. The number of bits 110 of the digital data 103 to be coded is the number of bits-to-be-allocated "5" which is determined by the psychoacoustic model 122, and the number output from the "one" adder 107 is "6", the subtracter 108 performs "5−6=−1" and outputs "−1" as the number of bits to-be-allocated to the bit allocation unit 102. The bit allocation unit 102 does not perform bit allocation for the digital data 103 "b' 11111". Therefore, the code 106 is not output. The bit stream generation unit 124 sends the number of bits to-be-allocated (allocated bits) 105 "−1" as the bit stream to the storage medium and the like.

With reference to FIG. 14(b), when the bit stream is sent through the storage medium to the decompression section 133, the bit stream decomposition unit 126 takes out and outputs the number of allocated bits 114 "−1".

The number of allocated bits 114 "−1" is input to the decoding apparatus 132. Since the given number "1" is input as the number of allocated bits 114, the lower-bit "one", generation unit 119 outputs lower bits 116 having a 8-bit length which are represented as "b' 11111111". The coupling unit 113 outputs the lower bits 116 "b' 11111111" output from the lower-bit "one" generation unit 119 as decoded data 117, because there is no code. The band composition unit 128 transforms the digital data 117 output from the decoding apparatus 132 from data in the frequency domain into data in the temporary domain, to restore the original audio data.

The decoded data 117 "b' 11111111" is identical to the digital data 151 "b' 11111111", as is apparent from comparison between them.

Although in the conventional apparatus, the bit allocation unit 123 compresses the 8-bit digital data into the 5-bit data and outputs the 5-bit data, in this illustrated example, the coding apparatus 131 of the second embodiment is capable of omitting all bits. Thereby, "no bits" occupy a data capacity. It should be remembered that information of the number of bits to-be-allocated 105 results in no increase in the data capacity because this is also necessary for the conventional apparatus.

In accordance with the decoding apparatus 132 of the decompression section 133 of the second embodiment, the original digital data is restored with precision as high as that in the conventional apparatus. Therefore, in this Operation 4, it is obvious that the original digital audio data can be restored without degrading its precision if the data compressed by the conventional apparatus is entirely omitted.

Thus, in accordance with the coding apparatus 131 of the second embodiment, the code 106 obtained by omitting lower bits of the number of continuous "b' 1" from the LSB plus "1" from the digital data 103 compressed according to the psychoacoustic model 122 is obtained, whereby the digital data 103 is represented as fewer bits. In addition, when all bits of the digital data 103 are represented as "b' 0", or only the MSB of the digital data 103 is "b' 0", the code 106 is not output. Further, as for the number of bits to-be-allocated 105 multiplexed into the bit stream, this corresponds to the number of bits to-be-allocated which is used in the conventional stereo shown in FIG. 19, and therefore, a data amount is not increased. As a consequence, the coding apparatus 131 can reduce the amount of digital data more than the conventional coding apparatus.

Furthermore, in accordance with the decoding apparatus 132 of the second embodiment, since the coding apparatus 131 omits the lower bits of ( the number of continuous "b' 1" from the LSB plus "1"), the lower-bit "one " generation unit 119 determines the number of omitted bits according to the number of allocated bits 114 and generates the lower bits 116 which are of the same number as the omitted bits and are represented as "b' 0" (MSB) and "b' 1" (bits other than MSB), and the coupling unit 113 couples the lower bits 116 to the lower side of the code 115. The original digital data is restored through a decoding process without degrading precision as much as that of the conventional apparatus.

Moreover, when the digital data 151 is "b' 01111111" or "b' 11111111", the number of allocated bits 114 input to the decoding apparatus 132 is "0" (Operation 3, FIGS. 13(a) and (b)) or the given value "−1" (Operation 4, FIGS. 14(a) and (b)), and therefore, the code 115 is not sent to the decoding apparatus 132 in these cases. In such cases, by using the given value "−1", whether the digital data 151 in which all bits have been omitted, is the "b' 01111111" or "b' 11111111" can be decided easily, and the lower bits 116 generated by the lower-bit "one " generation unit 119 can be restored correctly as the original digital data 151 (decoded data 117).

As illustrated in the first and second embodiments, in the compression section 130, the digital data 151 is compressed into the data 103 by using the psychoacoustic model 122 and the bit allocation unit 123, and the data 103 is input to the coding apparatus 131 as shown in FIG. 1.

On the other hand, in this third embodiment, the compression section 130 does not include the psychoacoustic model 122 and the bit allocation unit 123. In this case, digital data 151 to-be-compressed and the number of bits of the digital data 151 as the number of bits 110 are input to the coding apparatus 131. The construction of the other components are identical to those of the first embodiment. Assume that the bit length of digital data to-be-coded is also fixed as "8".

Hereinafter, examples of operation will be described.

FIGS. 15(a)–15(b) through 18(a)–18(b) show tables which contain data handled by the third embodiment. In these figures, figures(a) show data tables used by the coding apparatus 131 and figures(b) show data tables used by the decoding apparatus 132.

(Operation 1)

Operation 1 shows compression and decompression for the digital data 151 "b' 01011000".

With reference to FIG. 15(a), when the digital data 151 "b' 01011000" and the number of bits 110 "8" are input to the coding apparatus 131. The detection means 100 counts the number of continuous zeros from the LSB of the "b' 01011000" and outputs "3" as the number of continuous zeros 104, to the"one" adder 107, which adds 1 to the "3" and outputs "4" as an addition value 111. The number of bits 110 of the digital data 151 to be coded is "8", and the number output from the "one" adder 107 is "4", the subtracter performs "8−4=4" and outputs "4" as the number of bits to-be-allocated 105 to the bit allocation unit 102. The bit allocation unit 102 allocates 4 bits starting from the MSB of the "b' 01011000" of the digital data 151 and outputs "b' 0101" as the code 106. The bit stream generation unit 124 multiplexes the code 106 "b' 0101" and the number of bits to-be-allocated (allocated bits) 105 "4" into the bit stream, which is sent to the storage medium and the like.

With reference to FIG. 15(b), when the bit stream is sent from the storage medium to the decompression section 133, the bit stream decomposition unit 126 decomposes the bit stream into the code 115 "b' 0101" and the number of allocated bits 114 "4". The code 115 "b' 0101" and the number of allocated bits 114 "4" are input to the decoding apparatus 132. Since the number "4" is input as the number of allocated bits 114, and difference between the number "4" and the bit length of the digital data 151 "8" is "8−4=4" which is in the range of, "2 or more", the lower-bit "zero" generation unit 112 outputs lower bits 116 having a 4-bit length which are represented as "b' 1000" (MSB="b' 1" and bits other than MSB="b' 000"). The coupling unit 113 couples the lower bits 116 "b' 1000" to a lower side of the code 115 "b' 0101", and outputs "b' 01011000" as decoded data 117. The band composition unit 128 transforms the digital data 117 output from the decoding apparatus 132 from data in the frequency domain into data in the temporary domain, to restore the original audio data.

The decoded data 117 "b' 01011000" is identical to the digital data 151 "b' 01011000", as is apparent from comparison between them. In this illustrated Operation 1, 8-bit digital data is compressed into the 4-bit code, which is decoded into the 8-bit digital data without reducing precision, although the amount of information of bits to-be-allocated (allocated bits) is added as compared with a case where 8-bit digital data is directly transmitted.

(Operation 2)

Operation 2 shows compression and decompression operation for digital data 151 "b' 11011111".

With reference to FIG. 16(a), when the digital data 151, "b' 11011111"=0 and the number of bits 110 "8" are input to the coding apparatus 131. The detection unit 100 counts the number of continuous zeros from the LSB of the "b' 11011111" and outputs "0" as the number of continuous zeros 104, to the "one" adder 107, which adds 1 to the "0" and outputs "1" as the addition value 111. The number of bits 110 of the digital data 151 to be coded is "8", and the number output from the "one" adder 107 is "1", the subtracter 108 performs "8−1=7" and outputs "7" as the number of bits to-be-allocated to the bit allocation unit 102. The bit allocation unit 102 allocates 7 bits starting from the MSB of the "b' 11011111" of the digital data 151 and outputs "b' 1101111" as the code 106. The bit stream generation unit 124 multiplexes the code 106 "b' 1101111" and the number of bits to-be-allocated (allocated bits) 105 "7" into a bit stream, which is sent to the storage medium and the like.

With reference to FIG. 16(b), when the bit stream is sent through the storage medium to the decompression section 133, the bit stream decomposition unit 126 decomposes the bit stream into the code 115 "b' 1101111" and the number of allocated bits 114 "7". The code 115 "b' 1101111" and the number of allocated bits 114 "7" are input to the decoding apparatus 132. Since the number "7" is input as the number of allocated bits 114, and difference between the number "7" and the bit length of the digital data 151 "8" is "8−7=1", the lower-bit "zero" generation unit 112 outputs a lower bit 116 "b' 1". The coupling unit 113 couples the lower bit 116 "b' 1" to a lower side of the code 106 "b' 1101111", and outputs "b' 11011111" as decoded data 117. The band composition unit 128 transforms the digital data 117 output from the decoding apparatus 132 from data in the frequency domain into data in the temporary domain, to restore the original audio data.

The decoded data 117 "b' 11011111" is identical to the digital data 151 "b' 11011111", as is apparent from comparison between them. In this illustrated operation 2, 8-bit digital data is compressed into a 7-bit code, which is decoded into the 8-bit digital data without reducing precision, although the amount of information of bits to-be-allocated (allocated bits) is added as compared with a case where 8-bit digital data is directly transmitted.

(Operation 3)

Operation 3 shows compression and decompression operation for digital data 151 "b' 10000000".

With reference to FIG. 17(a), the digital data 151 "b' 10000000" and the number of bits 110 "8" are input to the coding apparatus 131. The detection unit 100 counts the number of continuous zeros from the LSB of the "b' 10000000" and outputs "7" as the number of continuous zeros 104, to the "one" adder 107, which adds 1 to the "7" and outputs "8" as the addition value 111. The number of bits 110 of the digital data 151 to be coded is "8", and the number output from the "one" adder 107 is "8", the subtracter 108 performs "8−8=0" and outputs "0" as the number of bits to-be-allocated 105 to the bit allocation unit 102. The bit allocation unit 102 does not perform bit allocation for the digital data 103 "b' 10000000". The bit stream generation unit 124 generates a bit stream comprising only the number of bits to-be-allocated (allocated bits) 105, which is sent to the storage medium and the like.

With reference to FIG. 17(b), when the bit stream is sent through the storage medium to the decompression section 133, the bit stream decomposition unit 126 takes out the number of allocated bits 114 "0", and outputs the "0" to the decoding apparatus 133. Since the number "0" is input as the number of allocated bits 114, and difference between the number "0" and the bit length of the digital data 151 "8" is "8−0=8", which is in the range of "2 or more", the lower-bit "zero" generation unit 112 outputs lower bits 116 having an 8-bit length which are represented as "b' 10000000" (MSB= "b' 1" and bits other than MSB "b' 0000000"). The coupling unit 113 outputs the lower bits 116 "b' 10000000" as decoded data 117. The band composition unit 128 transforms the digital data 117 output from the decoding apparatus 132 from data in the frequency domain into data in the temporary domain, to restore the original audio data.

The decoded data 117 "b' 10000000" is identical to the digital data 151 "b' 10000000", as is apparent from comparison between them. In this illustrated Operation 3, 8-bit digital data can be coded by using only information of the number of bits to-be-allocated, and the 8-bit digital data is restored by a decoding process without reducing precision. (Operation 4)

Operation 4 shows compression and decompression operation for digital data 151 "b' 00000000".

With reference to FIG. 18(a), the digital data 151 "b' 00000000" and the number of bits 110 "8" are input to the coding apparatus 131. The detection unit 100 counts the number of continuous zeros from the LSB of the "b' 00000000" and outputs "8" as the number of continuous zeros 104, to the "one"=0 adder 107, which adds 1 to the "8" and outputs "9" as the addition value 111. The number of bits 110 of the digital data 151 to be coded is "8", and the number output from the "one" adder 107 is "9", the subtracter 108 performs "8−9=−1" and outputs "−1" as the number of bits to-be-allocated 105 to the bit allocation unit 102. The bit allocation unit 102 does not perform bit allocation for the digital data 151 "b' 00000000", because the number "−1" is input thereto from the calculation unit 101. The bit stream generation unit 124 generates a bit stream comprising only the number of bits to-be-allocated (allocated bits) 105, which is sent to the storage medium and the like.

With reference to FIG. 18(b), when the bit stream is sent through the storage medium to the decompression section 133, the bit stream decomposition unit 126 takes out the number of allocated bits 114 "−1", and outputs the "−1" to the decoding apparatus 133. Since the number "−1" (given value) is input as the number of allocated bits 114, the lower-bit "zero" generation unit 112 outputs lower bits 116 having an 8-bit length as large as that of the digital data 151 which are represented as "b' 00000000". The coupling unit 113 outputs the lower bits 116 "b' 00000000" output from the lower-bit "zero" generation unit 112 as decoded data 117. The band composition unit 128 transforms the digital data 117 output from the decoding apparatus 132 from data in the frequency domain into data in the temporary domain, to restore the original audio data.

The decoded data 117 "b' 00000000" is identical to the digital data 151 "b' 00000000", as is apparent from comparison between them. In this illustrated Operation 4, 8-bit digital data can be coded by using only information of the number of bits to-be-allocated, and the 8-bit digital data is restored by a decoding process without reducing precision.

In this third embodiment, like the second embodiment, the means for detecting the number of continuous ones 118 and the lower-bit "one" generation unit 119 may be used.

Thus, in accordance with the coding apparatus 131 of the third embodiment, the code 106 obtained by omitting lower bits of the number of continuous "b' 0" from the LSB plus "1" from the digital data 151 output from the band division unit 121 is obtained, whereby the digital data 151 is represented as fewer bits. In addition, when all bits of the digital data 151 are represented as "b' 0", or only the MSB of the digital data are represented as "b' 1", the code 106 is not output. Further, as for the number of bits to-be-allocated 105 multiplexed into the bit stream, this corresponds to the number of bits to-be-allocated which is used in the conventional stereo shown in FIG. 19, and therefore, a data amount is not increased. As a consequence, the coding apparatus 131 of the third embodiment can reduce the amount of digital data more than the conventional coding apparatus.

Furthermore, in accordance with the decoding apparatus 132 of the third embodiment, since the coding apparatus 131 omits the lower bits of the number of continuous "b' 0" from the LSB plus "1", the lower-bit "zero" generation unit 112 determines the number of omitted bits according to the number of allocated bits 114 and generates the lower bits 116 which are of the same number as the omitted bits and are represented as "b' 1" (MSB) and "b' 0" (bits other than MSB), and the coupling unit 113 couples the lower bits 116 to the lower side of the code 115. The original digital data is restored through a decoding process without degrading precision as much as that of the conventional apparatus.

Moreover, when the digital data 151 is "b' 10000000" or "b' 00000000", the number of allocated bits 114 input to the decoding apparatus 132 is "0" (Operation 3) or the given value "−1" (Operation 4), and therefore, the code 115 is not sent to the decoding apparatus 132 in these case. In such cases, by using the given value "−1", whether the digital data 151 in which all bits have been omitted, is the "b' 10000000" or "b' 00000000" can be decided easily, and the lower bits 116 generated by the lower-bit "zero" generation unit 112 can be restored correctly as the original digital data 151 (decoded data 117).

While in the first to third embodiments, the digital data to-be-compressed 151 has an 8-bit length, an arbitrary bit length may be used. In addition, while the digital data 151 to-be-compressed has a fixed 8-bit length, in case of using digital data having a variable-bit length, information of this bit length is included in the bit stream, whereby compression and decompression can be performed by the coding apparatus and decoding apparatus of the present invention, respectively.

While in the first to third embodiments, "−1" is used as the uniquely given value, another value, i.e., a value unavailable as the bit length may be used. An advantage of use of the given value "−1" is that the value output from the subtracter 108 can be used.

While in the first to third embodiments, the coding apparatus 131 performs bit allocation starting from the MSB, it may perform bit allocation starting from the LSB, and the decoding apparatus 132 may generate upper bits which are to be coupled to an upper side of the code 115.

Furthermore, the coding apparatus 131 may include both of the means for detecting the number of continuous zeros and the means for detecting the number of continuous ones, and the decoding apparatus 132 may include both of the lower-bit "zero" generation unit and the lower-bit "one" generation unit. In this case, the coding apparatus 131 selects a smaller code 106 and outputs information indicating whether or not the number of continuous zeros has been detected, which is to be included in the bit stream, while the decoding apparatus 132, according to this information included in the bit stream, decides whether the lower-bit "zero" generation unit or the lower-bit "one" generation unit is to be used to perform the decoding process.

The coding/decoding process of the present invention is implemented by a computer program. The computer program is recorded in a recording medium from which a computer reads the program, whereby the coding/decoding process is implemented.

What is claimed is:

1. A coding apparatus which receives digital data as an input, said coding apparatus comprising:

detection means for detecting a number of continuous values, which detects either a number of continuous zeros or a number of continuous ones from a first endmost bit of the digital data;

calculation means for calculating a number of bits to-be-allocated, which subtracts an addition value obtained by adding the number of continuous values detected by said detection means and one, from a number of bits of the digital data, to obtain the number of bits to-be-allocated for the digital data; and bit allocation means for allocating bits from the digital data starting from a second endmost bit of the digital data which is opposite to the first endmost bit from which the number of continuous values is detected, and extracting the number of bits to-be-allocated from the digital data to create a code comprising the allocated bits, wherein the code and the number of bits to-be-allocated are output.

2. The coding apparatus of claim 1, wherein said calculation means outputs a given value as the number of bits to-be-allocated when the number of continuous values detected by said detection means is equal to the number of bits of the digital data, and wherein said bit allocation means does not allocate bits from the digital data and thereby does not output the code when said calculation means outputs the given value as the number of bits to-be-allocated.

3. A decoding apparatus which decodes digital data based on one of (a) a code obtained by omitting a number of bits equal to an addition value obtained by adding either a number of continuous zeroes or a number of continuous ones as a number of continuous values from a first endmost bit of the digital data and one, and a number of bits to-be-allocated indicating a number of bits of the code, and (b) the number of bits to-be-allocated, said decoding apparatus comprising:

bit generation means for generating a number of bits, the number of bits being obtained by subtracting the number of bits to-be-allocated from a number of bits of the digital data, wherein the number of bits generated are arranged such that a second endmost bit has a value different from the number of continuous values and bits other than the second endmost bit have values equal to the number of continuous values; and coupling means for coupling the number of bits generated by said bit generation means to the code, if the code exists, such that the second endmost bit of the number of bits generated by said bit generation means is coupled to a side of the code on which the omitted bits have been omitted, to restore the digital data or data which can be defined as the digital data, or if the code does not exist, passing the number of bits generated by said bit generation means as the digital data.

4. The decoding apparatus of claim 3, wherein said bit generation means generates the number of bits equal in number to the number of bits of the digital data, the number of bits having values equal to the continuous values when a given number is input as the number of bits to-be-allocated.

5. A coding method for compressing digital data, said coding method comprising:

detecting either a number of continuous zeros or a number of continuous ones from a first endmost bit of the digital data as a number of continuous values;

subtracting an addition value obtained by adding the number of continuous values and one from a number of bits of the digital data, to obtain a number of bits to-be-allocated to the digital data;

allocating bits starting from a second endmost bit of the digital data which is opposite to the first endmost bit, and extracting the number of bits to-be-allocated from the digital data, to create a code comprising the allocated bits; and outputting the code and the number of bits to-be-allocated.

6. The coding method of claim 5, wherein when the number of continuous values is equal to the number of bits of the digital data, said allocating does not allocate the bits starting from the second endmost bit, said extracting does not extract the number of bits to-be-allocated from the digital data to create the code, and said outputting only outputs a given value as the number of bits to-be-allocated.

7. A decoding method for decoding digital data based one of (a) a code which is obtained by omitting a number of bits equal to an addition value obtained by adding either a number of continuous zeros or a number of continuous ones as a number of continuous values from a first endmost bit of the digital data and one, and a number of bits to-be-allocated indicating a number of bits in the code, and (b) the number of bits to-be-allocated, said decoding method comprising:

subtracting the number of bits to-be-allocated from a number of bits of the digital data, to obtain a difference;

generating a number of bits equal in number to the difference, wherein the number of bits generated are arranged such that a second endmost bit has a value different from the number of continuous values and bits other than the second endmost bit have values equal to the number of continuous values; and coupling the number of bits generated by said generating to the code, if the code exists, such that the second endmost bit of the number of bits generated by said generating is coupled to a side of the code on which the omitted bits have been omitted, to restore the digital data or data which can be defined as the digital data, or if the code does not exist, passing the number of bits generated by said generating as the digital data.

8. The decoding method of claim 7 further comprising:

deciding whether or not the number of bits to-be-allocated is a given value, wherein if the number of bits to-be-allocated is the given value, said generating generates the number of bits equal in number to the number of bits of the digital data, the number of bits generated having values equal to the continuous values, to output the number of bits generated as the digital data or the data.

* * * * *